United States Patent [19]

Crandall

[11] 4,319,187

[45] Mar. 9, 1982

[54] METHOD FOR MEASURING THE DRIFT MOBILITY IN DOPED SEMICONDUCTORS

[75] Inventor: Richard S. Crandall, Princeton, N.J.

[73] Assignee: RCA Corporation, New York, N.Y.

[21] Appl. No.: 133,253

[22] Filed: Mar. 24, 1980

[51] Int. Cl.³ .............................................. G01R 31/26
[52] U.S. Cl. .............................................. 324/158 D
[58] Field of Search ........... 324/158 D, 158 T, 158 R; 364/481, 487, 488, 551

[56] References Cited

PUBLICATIONS

Fink, H. J., "Reverse Recovery...", Solid State Electronics, vol. 7, 1964, pp. 823-831.
"Switching Circuits: Measuring Recovery Time", Electronic Design, Nov. 11, 1959, pp. 199-203.
Spear, W. E., "Drift Mobility...", Journal of Non-Crystalline Solids, vol. 1, 1969, pp. 197-214.
Many et al., "Theory of Transient...", vol. 126, No. 6, Physical Review, Jun. 15, 1962, pp. 1980-1988.

Primary Examiner—Ernest F. Karlsen
Attorney, Agent, or Firm—Birgit E. Morris; Donald S. Cohen; Joseph D. Lazar

[57] ABSTRACT

A method for measuring the drift mobility of majority carriers in semiconductors consists of measuring the current transient in a Schottky-barrier device following the termination of a forward bias pulse. An example is given using an amorphous silicon hydrogenated material doped with 0.2% phosphorous. The method is particularly useful with material in which the dielectric relaxation time is shorter than the carrier transit time. It is particularly useful in material useful in solar cells.

5 Claims, 10 Drawing Figures

METHOD FOR MEASURING THE DRIFT MOBILITY IN DOPED SEMICONDUCTORS

The Government of the United States of America has rights in this invention pursuant to Department of Energy Contract No. AC03-78ET21074.

This invention relates to a method for measuring the drift mobility of majority carriers in electronic semiconducting materials in which the dielectric relaxation time is shorter than the drift transit times.

There are various known methods to measure the drift mobility of majority carriers in electronic materials. One of the most widely used methods is the so called time-of-flight method in which a pulse of light or other high energy radiation produces carriers at one face of a film of material. This method is described by W. E. Spear in an article entitled "Drift Mobility Techniques for the Study of Electrical Transport Properties in Insulating Solids" published in the *Journal of Non-Crystalline Solids*, 1 (1969) pp. 197–214, North Holland Publishing Co., Amsterdam. In this time-of-flight method, the pulse of carriers drifts in the applied electric field to the opposite face of the film. The sign of the charged carrier depends on the polarity of the applied field. However, this method works only when the dielectric relaxation time is longer than the transit time. If not, the charge packet is screened by the background charge resulting in a loss of time resolution causing thereby a difficulty in determining the transit time. Another known method that works only when the dielectric relaxation time is long is to measure the transient space-charge injection current. This method is described by A. Many and G. Rakavy in an article entitled "Theory of Transient Space-Charge-Limited Currents in Solids in the Presence of Trapping", *Physical Review*, Vol. 126, No. 6, June 15, 1962.

None of the known methods for measuring drift mobility, however, are applicable or useful for determining the drift mobility of majority carriers in conducting materials when the dielectric relaxation time is short compared to the transit time.

SUMMARY OF THE INVENTION

According to the present invention, the measurement of the drift mobility is based on a space-charge extraction technique. According to the method of the invention, the change of the depletion width is observed as the majority carriers are extracted from a Schottky-barrier device. The shape of the accompanying current transient is analyzed to provide the drift mobility of the majority carriers.

The method is implemented by reverse biasing with a DC voltage the device having a rectifying Schottky barrier. A forward bias voltage pulse is applied at the barrier to reduce the depletion width by injecting majority charges from the neutral bulk material into the space-charged region. The termination of the applied voltage pulse is determined and thereafter the time of duration of the current transient is monitored to determine the drift mobility of the majority carrier.

IN THE DRAWING

FIG. 5 is a plot of current versus voltage of an idealized device using the data illustrated in FIG. 3a.

Figure 1:
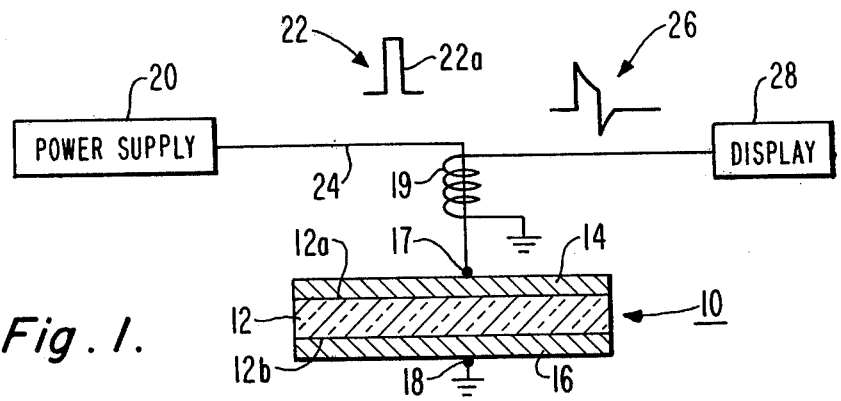
FIG. 1 is a schematic of an apparatus suitable for determining, according to the invention, the drift mobility of majority carriers in a specimen material.

As shown in FIG. 1, an apparatus useful in practicing the invention, is shown connected to a specimen device 10. The device 10 is formed of an electrical semiconducting material 12 attached to an upper metallic plate 14 and a lower metallic plate 16. The metal portion 14 is arranged to provide a rectifying junction with the upper face 12a of material 12 and the metal portion 16 provides an ohmic contact to the lower face 12b of the material.

In the preferred form of the invention, the device 10 is formed of an amorphous hydrogenated silicon material 12 useful in solar cell technology and the rectifying junction formed by the metallic portion 14 and the material 12 is a Schottky-barrier. The details for forming such a solar cell device is described in U.S. Pat. No. 4,064,521 issued on Dec. 20, 1977 to D. E. Carlson, entitled "Semiconductor Device Having a Body of Amorphous Silicon." Such a material (12) when doped has a dielectric relaxation time that is shorter than the drift transit time of majority carriers as will be explained further in detail hereinafter. It should be understood that any material that is conductive and can be provided with majority carriers will be useful in practicing the method of this invention.

Device 10 is provided with a bias from a suitable power supply 20 which provides the required voltage across the device at terminals 17 and 18 to effect a reverse bias condition. Briefly, in operation with the device 10 reverse-biased, a pulse of voltage from the power supply 20 as indicated by wave form 22 (FIG. 1b) is applied via path 24 to the device 10. As a result, a reduction in the depletion width of the device occurs with the simultaneous injection of majority charge carriers into the space-charge region of the device. During this time current flows through the device as shown by waveform 26 (FIG. 1b).

At the end of pulse 22, indicated by portion 22a, the transient current pulse (J) 26 (see FIG. 1b) is generated within the device 10. The current transient 26 is sensed and applied to a display 28 for observation or recording. Display 28 is preferably a cathode ray oscilloscope, but for certain applications a computer may be used to record the data corresponding to the transient current 26.

The transient current 26 is suitably sensed by a magnetic probe 19 coupled to device 10 as by a coil around lead 24. Alternatively, a voltage generated across a resistor (not shown) connected into the circuit between terminal 18 and ground may be used to provide an input signal lead representing the transient current to display 28.

Figure 1A:
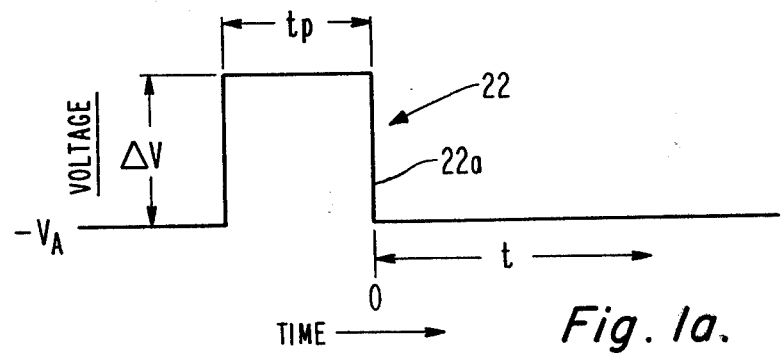
FIGS. 1a and 1b are enlarged views of the waveforms shown in FIG. 1.
Figure 1B:
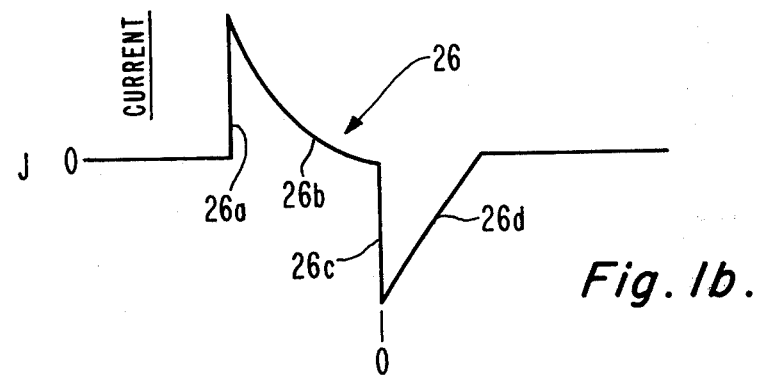

Current 26 as shown in FIG. 1b rises sharply at 26a following the reduction in negative voltage ($V_A$) by the change $\Delta V$. During the time $t_p$ of the pulse 22 (FIG. 1a), the current 26 (FIG. 1b) decays along path 26b until it reaches zero at the termination of voltage 22. The current transient resulting is represented by portion 26c which increases rapidly and then decays along path 26d until it returns to the original value of zero. Analysis of the current transient 26 provides information to determine the drift mobility of the majority carriers within the device 10 as will now be explained in detail.

Figure 2:
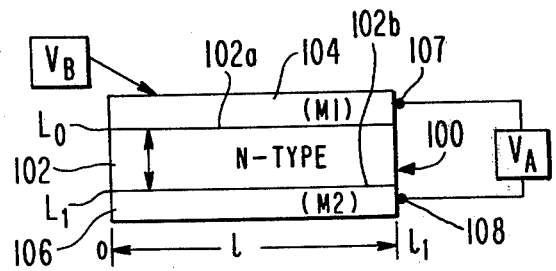
FIG. 2 is a schematic of a device illustrating the principles of the invention.
Figure 3A:
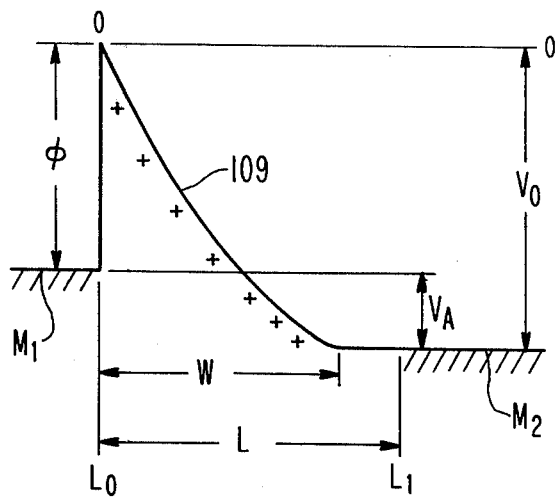
FIGS. 3a, 3b and 3c are curve plots of the potential energy versus distance for a device useful in understanding the invention.
Figure 3B:
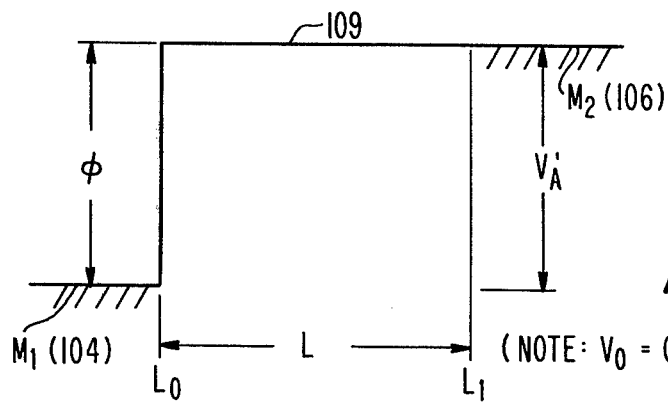

Consider that device 10 is an n-type semiconductor having an ideal Schottky-barrier. The electron potential energy versus distance (L) through the planar surface of the device ($L_0-L_1$) is represented in conventional form as shown in FIG. 3a. A model device 100 that will be used to describe the principle of the invention is illustrated in FIG. 2. Device 100 is formed of an n-type semiconductor material 102 having on the respective surfaces 102a and 102b a metal rectifying contact 104 preferably of the Schottky-barrier type at the surface of material 102 and an ohmic metallic contact region 106. The potential energy of the metallic contact 104 is represented by $M_1$ as will be used in FIGS. 3a, 3b and 3c, while the potential energy for the metallic region 106 is represented by $M_2$. The potential energy $\phi$ is the barrier height. A negative bias voltage $V_A$ is applied to the Schottky-rectifying barrier via terminals 107 and 108. With a steady negative bias $V_A$ applied to device 100, a positive space charge of density $\rho$, schematically represented by the +'s under conduction band 109 as shown in FIG. 3a, are contained in the portion of the device 100 designated for the depletion width region, and for $V_A'$, the region is defined as W. If the bias $V_A$ is changed to some value, say $V_A'$, such that the conduction band can just flatten, then electrons will flow from the bulk of the n-type material 102 into the region and neutralize the positive charges causing thus the depletion width to shrink towards zero provided that the change in the bias voltage is great enough. Furthermore, $V_0$ also shrinks towards zero. In the condition wherein the depletion width is zero and $V_0=0$, as shown in FIG. 3b, the conduction band 109 is horizontal having a constant value $\phi$ relative to the potential $M_1$ of the metallic contact region 104. Thus, the bias voltage $V_A'$ is equal to the potential $\phi$. Note further that the polarity of voltage $V_A'$ is reversed as compared to the bias voltage $V_A$ shown in FIG. 3a. Furthermore, $\phi$ is used in the conventional sense in that it represents the Schottky-barrier height. Note further that there are no space charges under conduction band 109 indicating the neutralization of the charges in the so-called space charge region.

If the bias is returned to its original value, $V_A$, electrons will flow from material portion 102 to region 106. Since no electrons can cross the Schottky-barrier interface 102a, the space charge region under band 109 will widen until it attains its original value W as shown in FIG. 3a, at which time current flowing through device 100 has decayed to zero.

Figure 3C:
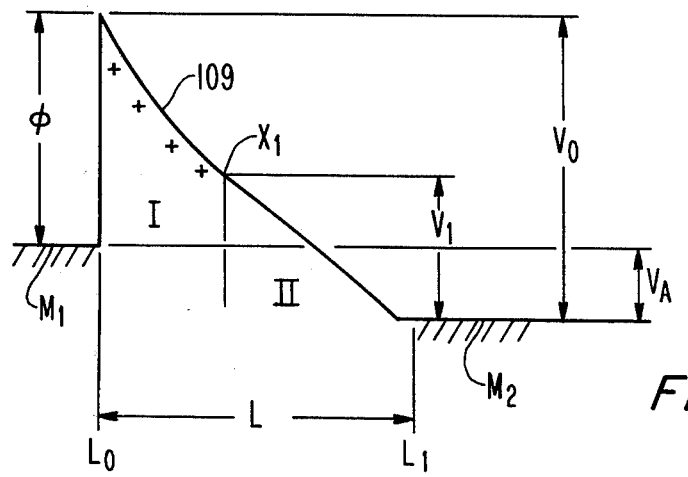

At some intermediate time before the current has decayed to zero, the electron potential energy is represented, for example, as shown in FIG. 3c. The boundary between the region that is filled with space charges, represented by I, and the neutral region in which there is no space charges, represented by II, is defined $X_1$. As electrons leave the space charge region I, boundary $X_1$ moves to the right of FIG. 3c. The speed at which the electrons move is determined by several parameters, viz., the mobility ($\mu$), the positive space charge of density $\rho$, and the electric field distribution. Because the region II extending from the boundary $X_1$ to the point $L_1$ is neutral, the field ($E_{II}$) therein will be a constant of magnitude $V_1/(L-X_1)$ where $V_1$ is the potential at boundary $X_1$. Since diffusion is usually neglected in the analysis of an ideal Schottky-barrier, the boundary at $X_1$ between regions I and II will be sharp. The field ($E_1$) in the space charge region I is nonuniform. This field decreases linearly from the point zero $L_0$ to the boundary $X_1$. This field is a solution of Poisson's classical and well known equation subject to the following boundary conditions:

$$V=V_0 \text{ at } X=0; \; V=V_1 \text{ at } X=X_1$$

The electron current (J) in region II of FIG. 3c is ohmic and is expressed by the following relationship $$J_{II}=ne\mu \, E_{II} \tag{1}$$

where $ne=\rho$ (the density of the space charge) and $\mu$ is the mobility characteristic of the majority charge flow through the region II of FIG. 3c. In region I, the current (J) is a pure displacement current given by the following relationship $$J_I=\epsilon \, (dE_1/dt) \tag{2}$$

where the dielectric constant is $\epsilon$ and $E_I$ is the field in region I. By equating equations (1) and (2), a differential equation for the boundary $X_1$ can be obtained.

However, in order to make such a solution, it is necessary to find the functional dependence of the fields $E_I$ and $E_{II}$ on the boundary parameter $X_1$. This is accomplished by solving Poisson's equation in region I. The first integral of Poisson's equation is represented by $$E_I=(\rho/\epsilon)X+E_b(t) \tag{3a}$$

where the constant $E_b$ (t) is found by noting that the time integral of the displacement current ($J_I$), equation 2 above, is just ½ the space charge density remaining in region I. This condition results in the following relationship $$E_b(t) = -\frac{V_o}{W_o}\left[1 + \frac{X_1}{W_o}\right] \tag{3b}$$

where $W_0=\sqrt{2\epsilon V_0/\rho}$. Note that $V_0=\phi-V_A$.

Equation (3a) is now integrated to find V(X). Once V(X) is found, the potential $V_1$ is determined from the condition $V_1=V(X_1)$. With such an integration the following relationship is established:

$$E_{II}=V_1/(L-X_1) \tag{3c}$$

The ohmic current in region II can be expressed in terms of the dimensionless variables $y=X_1/W_0$ and $a=W_0/L$ by the following relationships:

$$J_{II}=-J_0\,[1-y]/[1-ay]; \tag{4a}$$

$$J_0=ne\mu\,(V_0/L) \tag{4b}$$

The displacement current $J_I$ in region I is derived by a manipulation of equations 2, 3a and 3b resulting in the following relationship:

$$J_I = -\frac{\epsilon V_o}{W_o}\,\frac{dy}{dt} \tag{5}$$

Equations 4(a) and (5) may be used to develop a differential equation for the value y, which with the initial conditions of y=0 and t=0 results in the solution where:

$$t = \tau_c [(a - 1) \ln(1 - y) + ay] \quad (6a)$$
$$\tau_c = \frac{lW_o}{2V_o\mu} \quad (6b)$$

The relationship, as expressed in equation 6(a), between the value y and t can be used with equation 4(a) for determining the displacement current $J_{II}$ to provide an expression for the time dependence of that current. In general, the current $J_{II}$ can only be obtained by numerical solution of equation 6(a). Nevertheless, it will be apparent that inspection of equation 6(a) shows that at short times of t the value y increases linearly with time (t) and at long times, the value y approaches unity on an exponential basis.

On the basis of the above solution, of equation 6(a) whereby the current is shown to be time (t) dependent, the invention provides a means for utilizing that expression to determine the drift mobility of majority carriers. To verify the theoretical calculations, transient current measurements on a hydrogenated amorphous silicon (a-Si:H) film having a thickness of 1.6 micrometers were made. The film was produced by a dc glow charge discharge in silane ($SiH_4$) containing 0.2% phosphine. This produces an a-Si:H film containing phosphorus as a dopant. The amorphous silicon film was deposited on stainless steel at a temperature of about 300° C. After being removed from the growth system, a platinum Schottky-barrier of about 50 angstroms was put on the silicon surface by electron beam evaporation. The depletion width (W) was determined by measuring the capacitance at $5 \times 10^4$ Hz which is well below the dielectric relaxation frequency of this material at room temperature. The capacitance measured exhibited the expected dependence on reverse bias for a classical Schottky-barrier. For a detailed description of the manner in which such capacitance measurements are made see "Physics of Semiconductor Devices" by S. M. Sze, published by John Wiley & Sons, 1969, pp. 368–372. A thorough study of the subject is also disclosed in a paper by G. L. Miller et al., entitled "Capacitance Transient Spectroscopy", Ann. Rev. Mater, Sci. 1977, pp. 377–448 (1977).

Figure 4A:
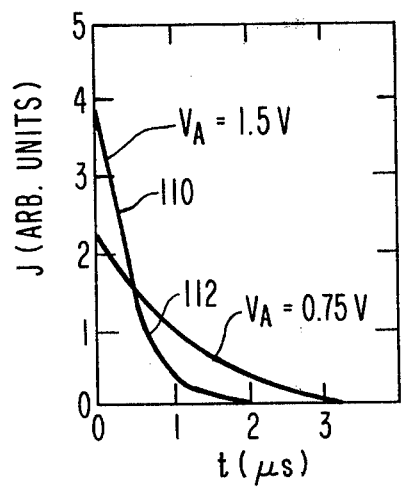
FIG. 4a is a plot of the experimental curves of current versus time and FIG. 4b is a plot of the normalized current versus time of that idealized device containing a theoretical curve (solid curve), the +'s and circles on the curve plot being data.

For transient current measurements, a negative dc bias ($V_A$) FIG. 2 is applied to the Schottky-barrier contact 104 via terminal 107 to establish the depletion width (w) in the film 102. Then a positive voltage pulse of magnitude $\Delta V$ (FIGS. 1 and 1a) is applied to the Schottky-barrier. The magnitude $\Delta V$ is chosen to flatten the conduction band 109 as shown in FIG. 3b. In the notation of FIGS. 3a and 3c discussed above, the value $\Delta V = V_0$ can be established by measuring the capacitance (C) as a function of voltage ($V_A$). The intercept on the voltage axis of a plot of $1/C^2$ versus $V_A$ gives $V_0$. See page 404 of the above-cited textbook by Sze for an illustration of such a plot. The voltage pulse $\Delta V$ remains on for a time $t_p$ (FIG. 1a) sufficient to neutralize the space charge. The time for this to occur is in the order of one microsecond. After the termination of the voltage pulse (22, FIG. 1a), the current transient 26d (FIG. 1c) due to electron extraction from the depletion region is observed. Plots of such current transients for bias voltages $V_A$ at 1.5 volts and 0.75 volts are shown in FIG. 4a by curves 110 and 112, respectively. The current J is detected by magnetic current probe 19 (FIG. 1) and amplified with a sampling scope such as display 28 as shown in FIG. 1. The two curves, 110 and 112, show clearly the effect of the dc bias on the current decay. If the current transient were due to capacitively charging the metal contacts 14 and 16 of FIG. 1 or 104 and 106 of FIG. 2, the decay time, i.e., the time for the current to drop ½ its initial value, would not depend on the value of the applied voltage $V_A$.

Figure 4B:
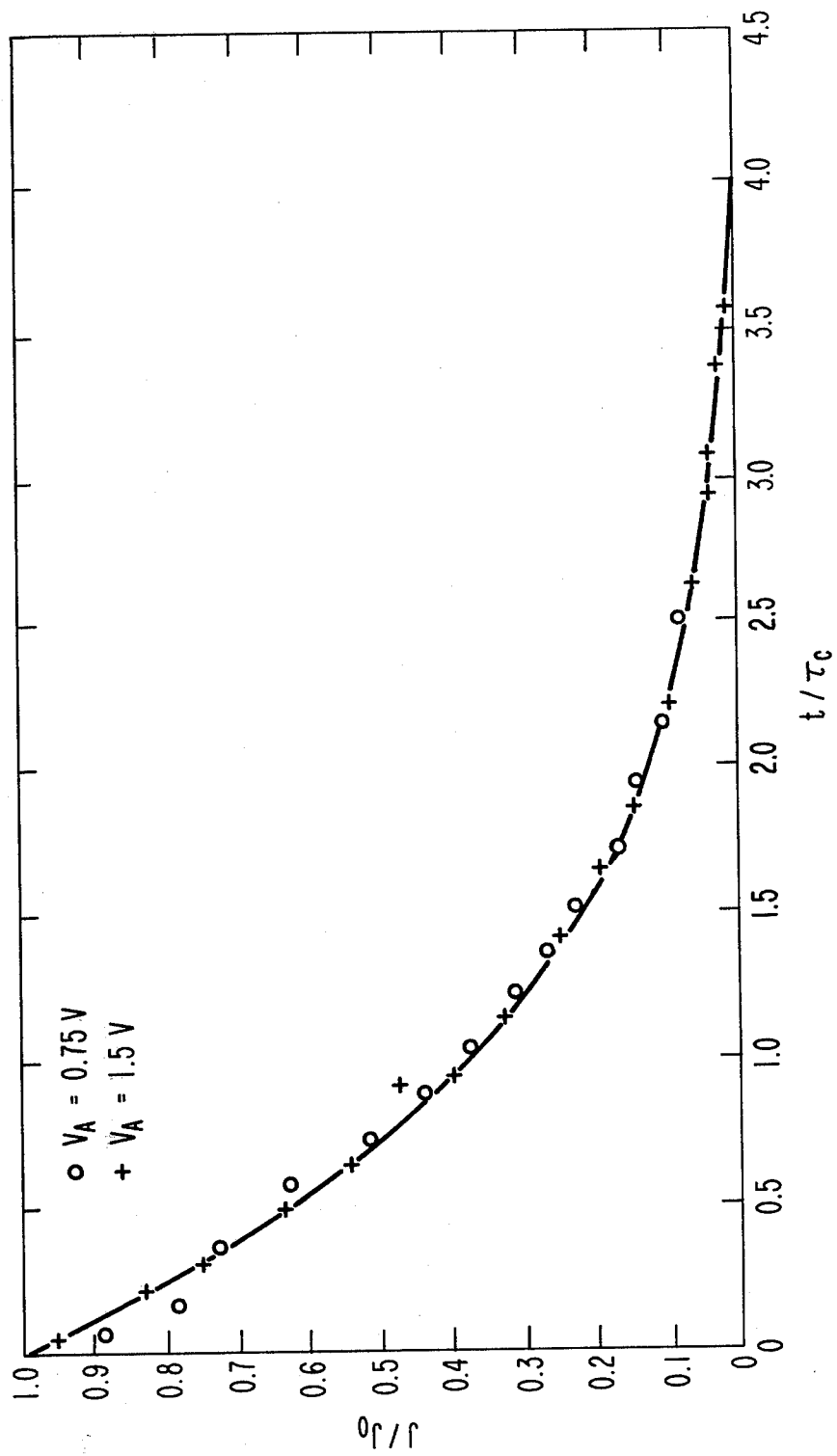

The curve shown in FIG. 4b as a solid curve is the normalized current (ordinate) versus normalized time (abscissa) derived from equations (4a) and (6a) described above. The data points represented by +'s and 0's are data for two different values of the applied voltage $V_A$. The associated current $J_0$ (Eq. 4(b)) and the characteristic time (Eq. 6(b)) were obtained by a "least square" fit to the theoretical curve in a manner known in the art. It is seen that there is substantial agreement between the theory and the experiment just described.

Figure 5:
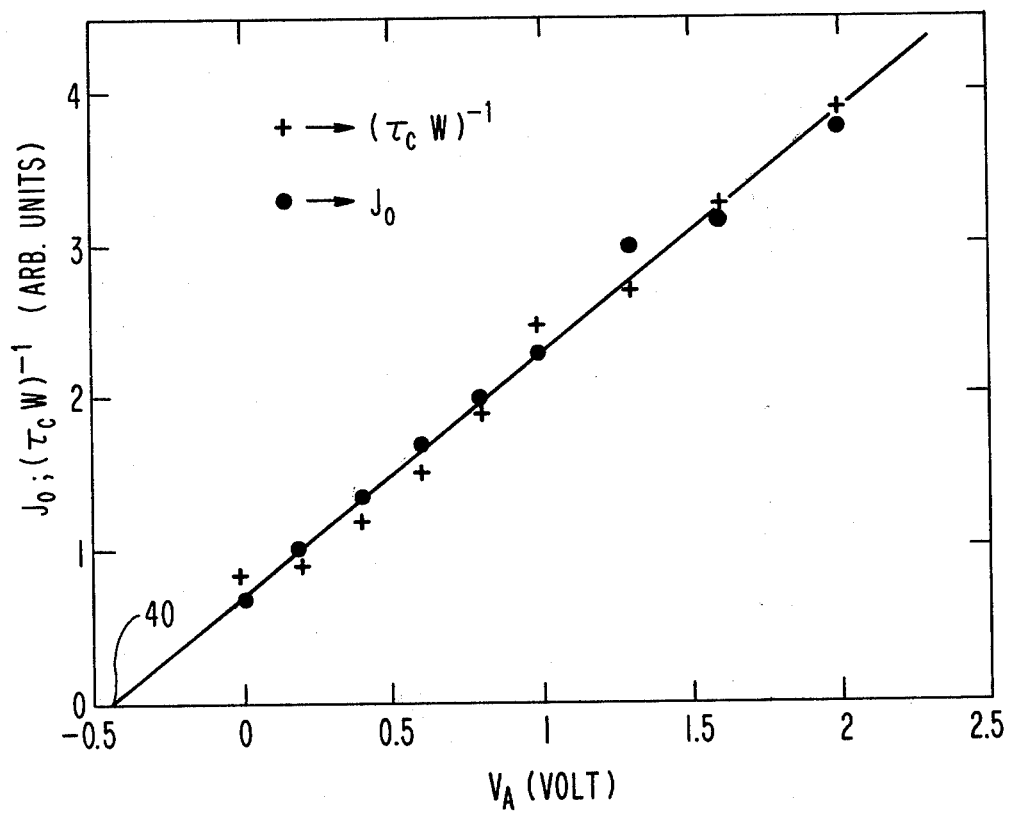

The data derived from the above experiments are replotted as shown in FIG. 5 where the current $J_0$ and the relationship $1/\tau_c W$ are plotted (0's and +'s respectively) against the applied voltage $V_A$. It is seen that these two quantities vary linearly with the applied voltage $V_A$. The intercept 40 on the abscissa of FIG. 5 gives the value of $V_0$ for $V_A = \phi$, noting that $V_0 = \phi - V_A$ as seen in FIG. 3a. This potential energy diagram for this intercept condition is plotted in FIG. 3c, discussed above. Thus, for this condition, $V_A = V_A'$. Using W and $V_0$, determined from the capacitance measurements and the time $\tau_c$ as in FIG. 4b, substitution of these parameters in Eq. 6b gives the mobility characteristic of the majority carriers $\mu$. It was found that $\mu = 2.3 \times 10^{-3}$ cm$^2$/V-sec at 302° K. This value of $\mu$ is lower than has been previously reported for undoped and lightly doped amorphous hydrogenated silicon (a-Si:H). See, for example, an article in the Physical Review Letters, 24 Aug. 1970, Vol 25, No. 8, by P. G. LeComber and W. E. Spear, entitled "Electronic Transport in Amorphous Silicon Films", and an article by A. R. Moore entitled, "Electron and Hole Drift Mobility in Amorphous Silicon" published in the Applied Physics Letters, Vol. 31, No. 11, 1 Dec. 1977, for descriptions of previous determinations of drift mobility of electrons using the so called time-of-flight technique mentioned above. The low mobility revealed by the data as plotted in FIG. 5 may be due to the heavy phosphorus dopant.

It will be apparent in view of the above description, that the measurement of the majority carrier drift mobility in any electrical semiconducting material is easily and quickly determined. Although in the experiments performed, the dielectric relaxation time of the material was shorter than the drift transit time of the majority carrier, the theory developed above does not require such a limitation.

In summary, the process of the invention involves reverse biasing a rectifying junction such as the Schottky-barrier, applying a forward bias voltage pulse of sufficient magnitude to reduce the depletion width, injecting majority carriers into the space charge region and then monitoring the time of duration of a current transient through the device following the termination of the forward biased pulse to determine the drift mobility of the majority carriers.

The invention may be practiced in many ways and is useful particularly in the field of conducting amorphous materials. Furthermore, although a Schottky-barrier device was used in the experiments, any rectifying device such as a PIN diode may be used with appropriate modification of the equation described above. Furthermore, the material of the body 12 (FIG. 1) may be N or P type.

What is claimed is:

1. A method of measuring the majority carrier drift mobilities in electrical semiconducting materials in which the dielectric relaxation time of the material can be longer or shorter than the drift transit time of the majority carrier, comprising the steps of:

reverse biasing with a DC voltage a device formed of the electrical semiconducting material and having one Schottky-barrier contact and one ohmic contact;

applying a forward bias voltage pulse of sufficient magnitude and duration to inject majority charges into the space charge region of the device to neutralize the space charge therein;

determining the time of the termination of the applied voltage pulse;

monitoring the shape of a current transient curve resulting from removing the forward bias pulse through the device, and then determining the drift mobility of the majority carriers, by fitting the shape of said monitor current transient curve to the shape of the theoretical normalized majority carrier current transient curve by adjusting the majority carrier drift mobility.

2. A method according to claim 1, wherein the material is doped hydrogenated amorphous silicon.

3. A method according to claim 2, wherein the material is n-type hydrogenated amorphous silicon.

4. A method according to claim 1, wherein the monitoring step includes displaying on a cathode ray oscilloscope a wave form corresponding to the current transient developed in the material at the termination of the applied voltage pulse.

5. A method according to claim 1, wherein the monitoring step includes applying a signal to a computer corresponding to the current transient in the material developed at the termination of the applied voltage pulse and calculating the drift mobility of the majority carriers from the signal.

* * * * *